United States Patent [19]

Mueller

[11] Patent Number: 5,732,702
[45] Date of Patent: Mar. 31, 1998

[54] METHOD AND APPARATUS FOR FUNCTIONAL IMAGING

[75] Inventor: Edgar Mueller, Heroldsbach, Germany

[73] Assignee: Siemens Aktiengesellschaft, Munich, Germany

[21] Appl. No.: 783,892

[22] Filed: Jan. 16, 1997

[30] Foreign Application Priority Data

Feb. 19, 1996 [DE] Germany ............... 196 06 090.7

[51] Int. Cl.⁶ ........................................... A61B 5/055
[52] U.S. Cl. ........................... 128/653.2; 324/309
[58] Field of Search ........................... 324/306, 307, 324/309; 128/653.2; 382/131

[56] References Cited

U.S. PATENT DOCUMENTS

| | | |
|---|---|---|
| 4,165,479 | 8/1979 | Mansfield . |
| 4,922,203 | 5/1990 | Sillerud et al. ............ 324/307 |
| 4,993,075 | 2/1991 | Sekihara et al. ............ 382/6 |
| 5,068,609 | 11/1991 | Bruder et al. ............ 324/309 |
| 5,138,259 | 8/1992 | Schmitt et al. . |
| 5,304,929 | 4/1994 | Fang et al. ............ 324/309 |
| 5,363,043 | 11/1994 | Xiang et al. ............ 324/309 |
| 5,433,199 | 7/1995 | Cline et al. ............ 128/653.1 |
| 5,565,777 | 10/1996 | Kanayama et al. . |
| 5,581,184 | 12/1996 | Heid ............ 324/309 |
| 5,647,362 | 7/1997 | Fuderer et al. ............ 324/309 |
| 5,652,515 | 7/1997 | Kondo ............ 324/309 |

OTHER PUBLICATIONS

"Processing Strategies for Time–Course Data Sets in Functional MRI of the Human Brain," Bandettini et al Magnetic Resonance in Medicine, vol. 30, pp. 161–173 (1993).

*Primary Examiner*—Marvin M. Lateef
*Assistant Examiner*—Shawna J. Shaw
*Attorney, Agent, or Firm*—Hill, Steadman & Simpson

[57] ABSTRACT

In a method and apparatus for functional imaging an impulse sequence is used in which an examination subject is charged with a readout gradient with sub-pulses of alternating polarity. By means of at least two-dimensional Fourier transformation, an image data matrix having N rows is generated from the raw data thereby acquired. After a stimulation of the subject, a second image data matrix is acquired. The coincidence of opposed signal changes that occur at two pixels disposed from each other by a distance of N/2 rows in the image matrix is checked. Found coincidences are evaluated as functional activity.

4 Claims, 5 Drawing Sheets

5,732,702

METHOD AND APPARATUS FOR FUNCTIONAL IMAGING

BACKGROUND OF THE INVENTION

1. Field of the Invention

The invention is directed to a method for functional imaging by means of magnetic resonance, of the type wherein, in order to acquire measurement data from at least one sub-region of an examination subject, the subject is disposed in a basic magnetic field and is charged with radio-frequency pulses per measurement scan, with a phase encoding gradient and readout gradient with sub-pulses of alternating polarity being subsequently activated, a nuclear resonance signal that arises under each sub-pulse of the readout gradient is scanned, and whereby the scan values acquired in this way for each sub-pulse are entered in a row of a raw data matrix, with the direction of entering the valves along a row being varied according to the respective polarity of the sub-pulses, with N raw data rows being acquired, and an image data matrix having N rows is acquired from the raw data matrix by means of at least two-dimensional Fourier transformation.

2. Description of the Prior Art

In functional imaging with MR, after neuronal activation of functional brain areas of a subject, small signal changes are observed in T2*-weighted sequences, such as e.g. EPI or FLASH with long echo times TE. Stimulation experiments of this type are carried out, for example, with visual or motor stimulation or on the basis of cognitive tasks. Both the BOLD effect (changes in the local concentration of oxygen in the capillary, venule and vein regions) and changes in local blood flow play a role in producing the signal changes. According to current knowledge, the BOLD effect is dominant. This effects a local change in susceptibility and thus, by causing different dephasing of the local spin system, the observed signal changes arise.

Problems associated with functional imaging are the difficulty acquiring the relatively small signal changes and separating them from other signal changes caused, for example, by motion and flow. For achieving separation from other signal changes, in the article by P. A. Bandettini et al., "Processing Strategies for Time-Course Data Sets in Functional MRI of the Human Brain," Magnetic Resonance in Medicine 30, pages 161–173 (1993), among others, it is proposed to calculate for each pixel a correlation coefficient between the stimulation function and the acquired chronological signal curve. As a stimulation function, periodically repeated stimulations separated by pauses are used. Periodic stimulation functions, however, have several disadvantages.

Periodic noise processes (e.g. heartbeat, breathing) cannot be separated from the activity signal, and appear as "physiological noise." Processes that show a delay of whole-number multiples of the repetition period likewise cannot be correctly recognized.

In addition, periodic stimulation functions have a non-uniform frequency spectrum. Certain spectral components are accordingly excited only weakly or not at all by the stimulation. This introduces a systematic error into the system identification, i.e. the determination of the parameters of a mathematical model.

To address this problem, it is known to use non-periodic stimulation functions. Changes of activity in the patient are detected by means of a chronological correlation of the information acquired in this way.

It is known that so-called N/2 ghost images occur given a pulse sequence with alternating readout gradients, in particular in the EPI sequence. These N/2 ghost images are generally corrected by means of a subsequent image processing. A correction method of this sort is for example specified in German OS 40 05 675 corresponding to U.S. Pat. No. 5,138,259.

SUMMARY OF THE INVENTION

An object of the present invention is to provide a method for functional imaging wherein a simple and reliable evaluation criterion for the determination of functional activities is employed.

This object is inventively in a functional imaging method of the type initially described wherein, after a stimulation of the subject two pixels of the image matrix, at a spacing of N/2 lines from each other, are checked for the coincidence of opposed signal changes, and coincidences that are found are evaluated as functional activity. An acquisition of functional activities is thus achieved that is virtually uninfluenced by other phenomena. No additional measurement data must be acquired, which is particularly important with respect to the time-critical acquisition of functional activities.

In an embodiment, functional activity is determined only in relation to those pixels for which a signal increase in a central region of the subject coincides with a signal attenuation in the ghost region displaced by N/2 rows. For blood, the change in susceptibility connected with a functional activity will lead to a signal increase in the actual subject region and to a signal attenuation of the "ghost signal."

DESCRIPTION OF THE PREFERRED EMBODIMENTS

The inventive method can be used with all pulse sequences in which the nuclear resonance signals are read out under readout gradients with alternating signs (polarities). In the following, an exemplary embodiment is explained on the basis of the EPI (echoplanar imaging) method. An exact specification of the EPI method can be found in German PS 27 55 956.

Figure 1:
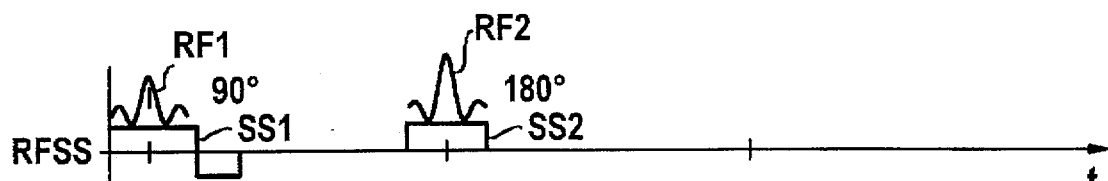
FIGS. 1 to 4 illustrate a typical pulse sequence according to the EPI method.

According to FIG. 1, in the EPI method shown as an example a 90° RF pulse RF1 is emitted under the effect of a slice section gradient SS1, so that the 90° RF pulse excites only a selected slice of the subject on the basis of the slice selection gradient SS1.

Figure 2:
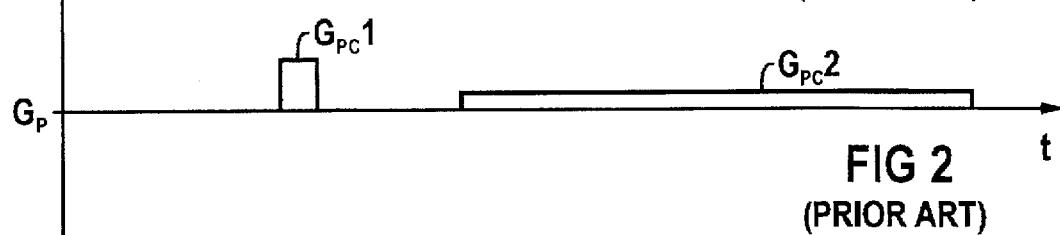
Figure 3:
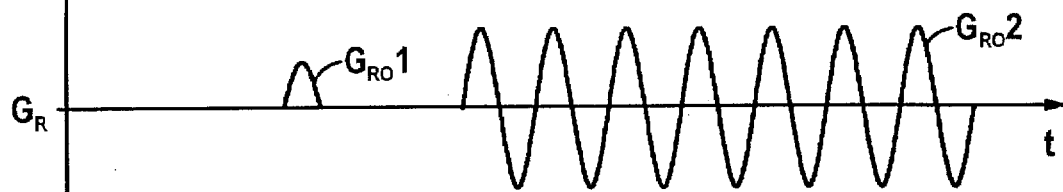
Figure 4:
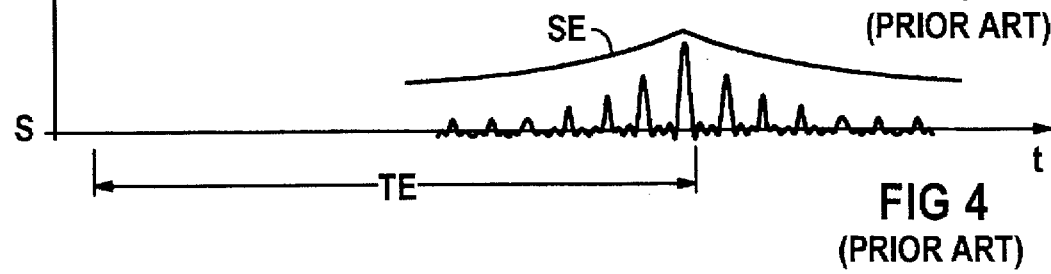

After the excitation, according to FIG. 2 pre-phasing gradients $G_{PC1}$ are activated in the phase encoding direction, and according to FIG. 3 pre-phasing gradients $G_{RO1}$ are activated in the readout direction. There follows a 180° RF pulse RF2, which again excites only the selected slice of the subject on the basis of a simultaneously activated slice selection gradient SS2. Finally, a readout gradient $G_{RO2}$ is activated, which is assembled from individual pulses of alternating polarity. By means of the alternating polarity, the nuclear resonance signal that arises is dephased with one polarity change and is then rephased again upon the next change, so that the signal curve S shown in FIG. 4 arises. The individual signals are scanned in a fixed time grid, digitized, and the measurement values acquired in this way are entered per signal into a row of a raw data matrix, as shown schematically in FIG. 5. The raw data matrix RD can be regarded as a measurement data space, or as a measurement data plane in the two-dimensional case present in the exemplary embodiment. This measurement data space is designated in general as "k-space" in nuclear spin tomography.

According to FIG. 2, during the readout phase a phase encoding gradient $G_{PC2}$ is in addition activated in the phase encoding direction with constant polarity. In place of the continuous phase encoding gradient $G_{PC}$ shown in FIG. 2, individual pulses of the phase encoding gradient can alternatively be used before the individual pulses of the readout gradient $G_{RO2}$. In this pulse sequence, the readout gradient $G_{RO2}$ effects a frequency encoding of the signal S in the readout direction. The phase encoding gradient $G_{PC}$ effects a phase encoding in the phase encoding direction, with the respective time integral of the gradient $G_{PC}$ controlling the phase position of the nuclear spins. The readout gradients $G_{RO}$, phase encoding gradient $G_{PC}$ and slice selection gradient $G_{SS}$ are oriented perpendicular to one another, e.g. in the respective directions x, y, z of a Cartesian coordinate system.

The information, required for image generation, concerning the spatial origin of the signal contributions S is coded in the phase factors, whereby the interrelationship between the locus space (thus the image) and the k-space exists mathematically via a two-dimensional Fourier transformation. The following holds:

$$S(k_x,k_y) = \iint \rho(x,y) e^{i(k_x x + k_y y)} dx dy$$

The following definitions thereby hold:

$$k_x(t) = \int_0^t G_x(t') dt'$$

$$k_y(t) = \int_0^t G_y(t') dt'$$

$\rho(x,y)$=nuclear spin density at the locus x,y
$\gamma$=gyromagnetic ratio
$G_x(t')$=instantaneous value of the readout gradient GRO
$G_y(t')$=instantaneous value of the phase encoding gradient GPC It is presupposed that the readout gradient $G_{RO}$ lies in the x-direction and the phase encoding gradient $G_{PC}$ lies in the y-direction of the Cartesian coordinate system.

The signal S is measured as a complex quantity by means of phase-sensitive demodulation. The analog signal acquired in this way is scanned in a time grid, and the scanned values are digitized and entered into a row of a raw data matrix RD, shown in FIG. 5, per individual pulse of the readout gradient $G_{RO}$. Complex values S(i,j) are read out under each individual pulse of the readout gradient $G_{RO}$. In the raw data matrix RD, i designates the row index and j the column index. After each excitation, there follow N individual pulses of the readout gradient $G_{RO}$, so that the measurement matrix contains N rows. In total, an N×N matrix is obtained.

Since the polarity of the gradient $G_{RO}$ alternates, the measurement values are likewise entered into the raw data matrix RD in alternating fashion, first with increasing j-values (column index values) and in the next row with decreasing j-values. An image data matrix BD can be calculated from the raw data matrix RD by means of a two-dimensional Fourier transformation. The method usually used for this purpose is explained in more detail in German PS 28 55 956. The direction of the sampled value entry is indicated schematically by arrows in FIG. 5.

Figure 6:
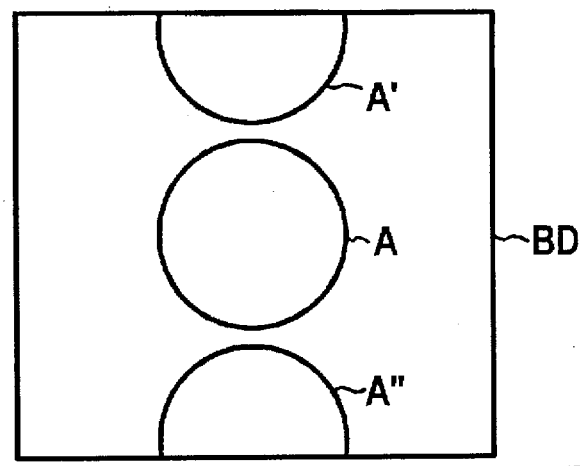
FIG. 6 schematically illustrates an image data matrix of the type generated using a method such as the EPI method.
Figure 7:
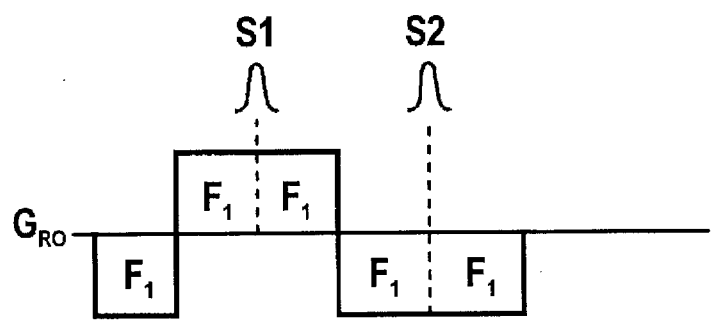
FIGS. 7 and 8 show the echo positions inside the EPI pulse sequence.

If the positive sub-pulses of the readout gradient GR2 are somewhat different from the negative sub-pulses, so-called N/2 ghosts occur. As shown in FIG. 6, this causes a subject to be imaged, e.g. a circle A, to be additionally imaged in the N×N image data matrix BD, displaced by N/2 points. Pixels that would otherwise lie beyond the upper edge of the image data matrix BD are pushed in from the lower edge. In FIG. 6, the ghost image that arises is designated A', A". The cause of the occurrence is explained in more detail below on the basis of FIGS. 7 and 8.

If the amplitude-time areas of positive and negative sub-pulses of the readout gradient $G_{RO}$ are completely equal, the corresponding nuclear resonance signals S1 and S2 occur exactly in the center of the scanning interval synchronized with the respective sub-pulse. In other words, the signals S1 and S2 come to lie in the center of the raw data matrix RD and are thus arranged under one another in the rows.

Figure 5:
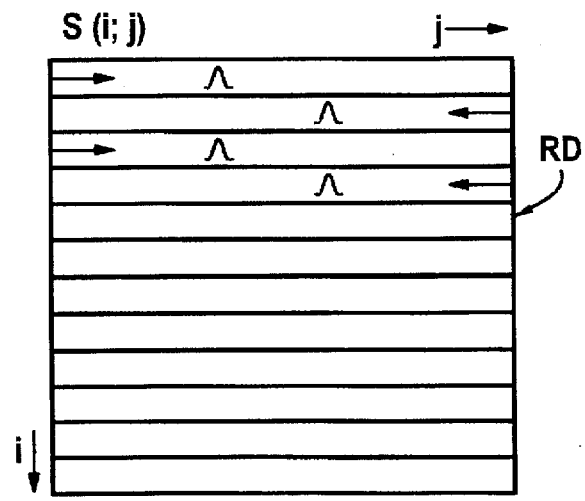
FIG. 5 schematically illustrates a raw data matrix of the type generated using a method such as the EPI method.
Figure 8:
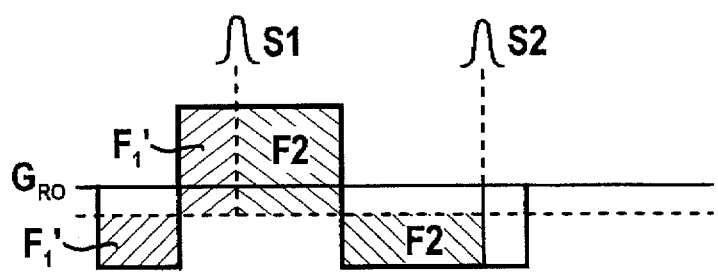

If the amplitude-time areas of the positive and negative sub-pulses of the readout gradient $G_{RO}$ are different, however, the individual echoes S1 and S2 are displaced against one another. As shown in FIG. 8, this can occur, for example, due to magnetic field non-homogeneities superimposed on the basic magnetic field and on the readout gradient $G_{RO}$. The rephasing condition, namely that the amplitude-time integral be zero, is fulfilled earlier in the case, shown in FIG. 8, of a negative superposition for the nuclear resonance signal S1 read out under a positive sub-pulse, and is fulfilled later for the nuclear resonance signal S2, read out under the negative sub-pulse. In FIG. 5, the resulting positions of the nuclear resonance signals S1 and S2 in the raw data matrix RD are shown.

Due to the regularities of the Fourier transformation, the position of the nuclear resonance signals, alternating from row to row, leads to the occurrence of an additional image displaced by N/2 rows, i.e. the above-described N/2 ghost image, in addition to the actual, correctly positioned image of the subject.

The aforementioned ghost image effect occurs not only with magnetic field non-homogeneities due to non-ideal magnet systems, e.g. due to a poor shimming of the magnets, but also so due to susceptibility effects. Less-oxygenated blood exhibits paramagnetic characteristics, with corresponding field disturbances caused by susceptibility, and corresponding ghost images. With an increase in blood oxygenation, caused by activity, the intravascular desoxyhemoglobin is reduced. The susceptibility artefacts, and thus also the signal intensity of the associated ghost image, are thereby reduced.

This effect is exploited in the inventive method in order to determine changes in local oxygen concentration, and thereby to identify brain functions. While heretofore it has always been attempted to eliminate ghost images as noise factors, these are now inventively put to use for functional imaging. Uncorrected images are thereby searched for pixels (or groups of pixels) that in the phase encoding lie apart from each other by N/2 rows. These pixels (or groups of pixels) are then examined pair by pair to determine whether a signal change in the subject image falls together with an opposed signal change in the associated ghost image, i.e. in the pixels displaced by N/2. Since, as explained, brain activities lead to a reduction of intensity in the ghost images, those pixels are preferably selected in which an increase in signal intensity of a pixel in the subject image stands opposite a decrease of the allocated pixel in the ghost image.

Given a resonant frequency displacement $\Delta f$ in a single-shot EPI sequence, the ratio of the signal intensity of the ghost image IG to the subject image IS is dependent above all on the echo—echo distance $\Delta TE$:

$$IG/IS = \tan(\pi \cdot \Delta TE \cdot \Delta f)$$

IG is the intensity of an observed pixel/pixel group in the ghost region, and IS is the intensity in the corresponding subject region. Given a change in the concentration of blood oxygen from 60% to 70%, the resonant frequency is displaced by about 3 Hz. Given an echo—echo distance $\Delta TE$ of 2 ms, a change in the ratio of the signal intensity of 2% thereby results. The absolute signal difference is thus relatively small, but the probability of finding local field changes is high, due to the above-explained presupposition of the coincidence of opposed signal changes.

It is particularly important that with this measurement design, in contrast to conventional methods, there are no falsifications due to blood flow. By means of the coincidence criterion, signal changes due to inflow effects can be cleanly separated from changes in the oxygen concentration caused by activity.

Figure 9:
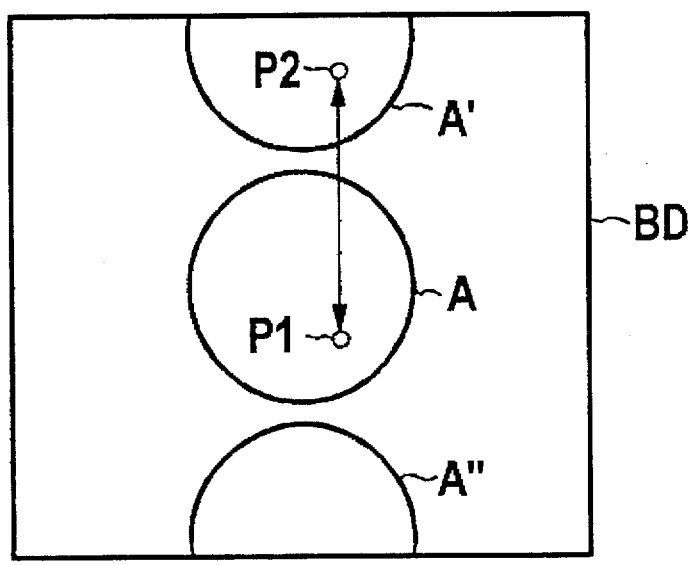
FIGS. 9 and 10 schematically illustrates a ghost image of the type generated using a method such as the EPI method.
Figure 10:
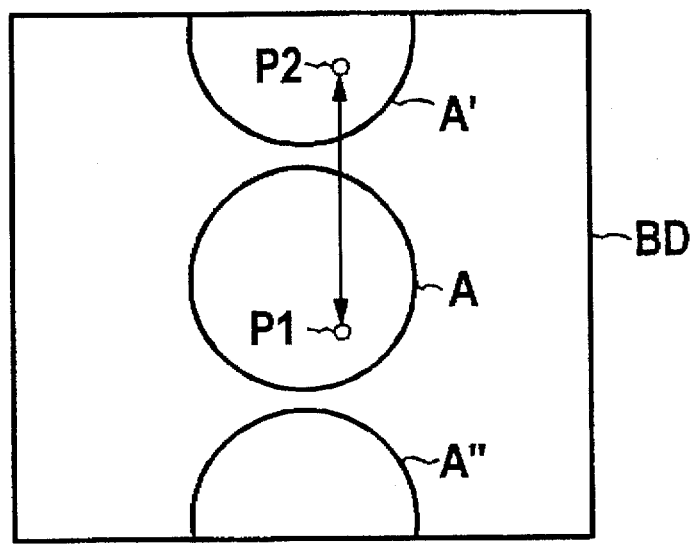

The signal change in the image is explained below on the basis of the schematic illustrations according to FIGS. 9 and 10. Let FIG. 9 be the image before activation. A is thereby in turn the subject region, e.g., a section through the brain; A' and A" represent the ghost image, which is folded around downwardly from the upper edge. The point P1 in the subject region A corresponds to the point P2, displaced by N/2 rows, in the ghost image A'. If, for example, a functional activity now occurs in point P1, the signal intensity increases in this point, for the reasons explained above. At the same time, the intensity decreases in point P2. FIG. 10 shows the image after a stimulation of the patient, which stimulation causes a functional activity, e.g. in the point P1. It is distinguished from the image according to FIG. 9 in that an increase in the signal intensity in point 1 correlates with a reduction of the signal intensity in point 2. This can be considered a reliable criterion for a functional activity in point P1. Of course, all other image points are also monitored for the correlation of opposed signal changes in the subject region and in the ghost image, so that for all these points the functional activity after a stimulation is received.

Figure 11:
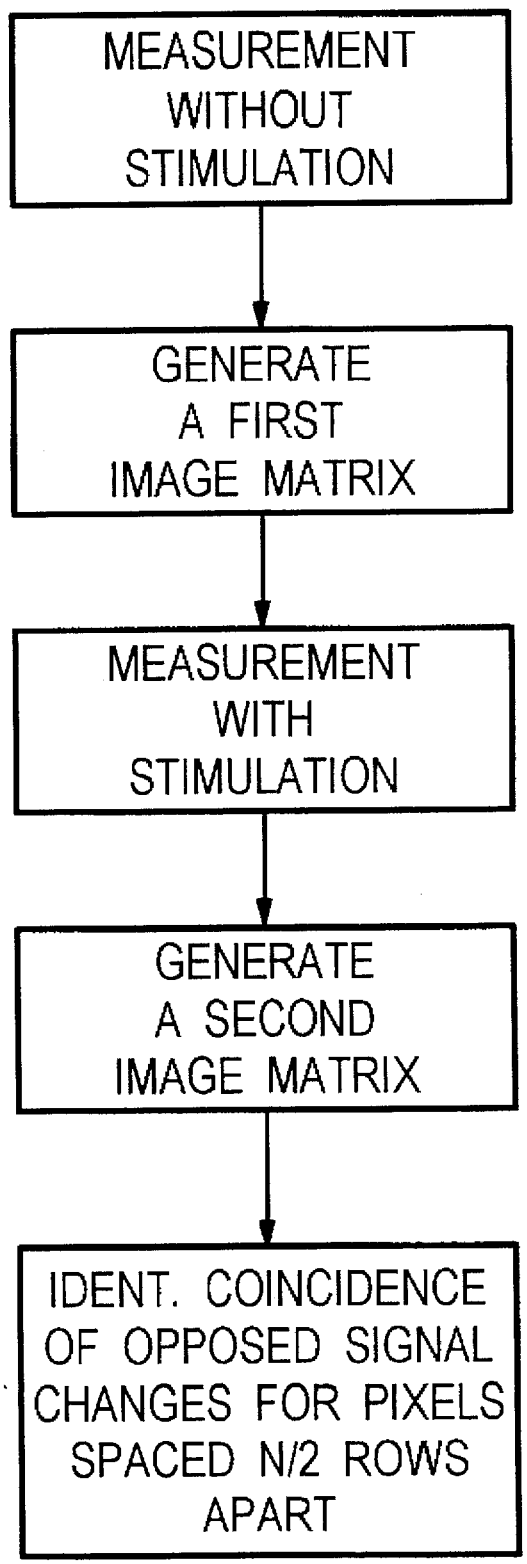
FIG. 11 is a flow chart of the inventive method.

FIG. 11 shows a block diagram summarizing the method. In a first step, there first ensues a measurement of a subject region, e.g. of a slice in the brain without stimulation. A first image matrix is produced from the raw data thereby acquired. A stimulation is subsequently carried out and the same subject is measured again. After image reconstruction, a second image matrix is obtained from this measurement. From the two image matrices, the functional activity in the observed subject region is obtained by means of the determination of the coincidence of opposed changes in pixels displaced by N/2 rows.

Figure 12:
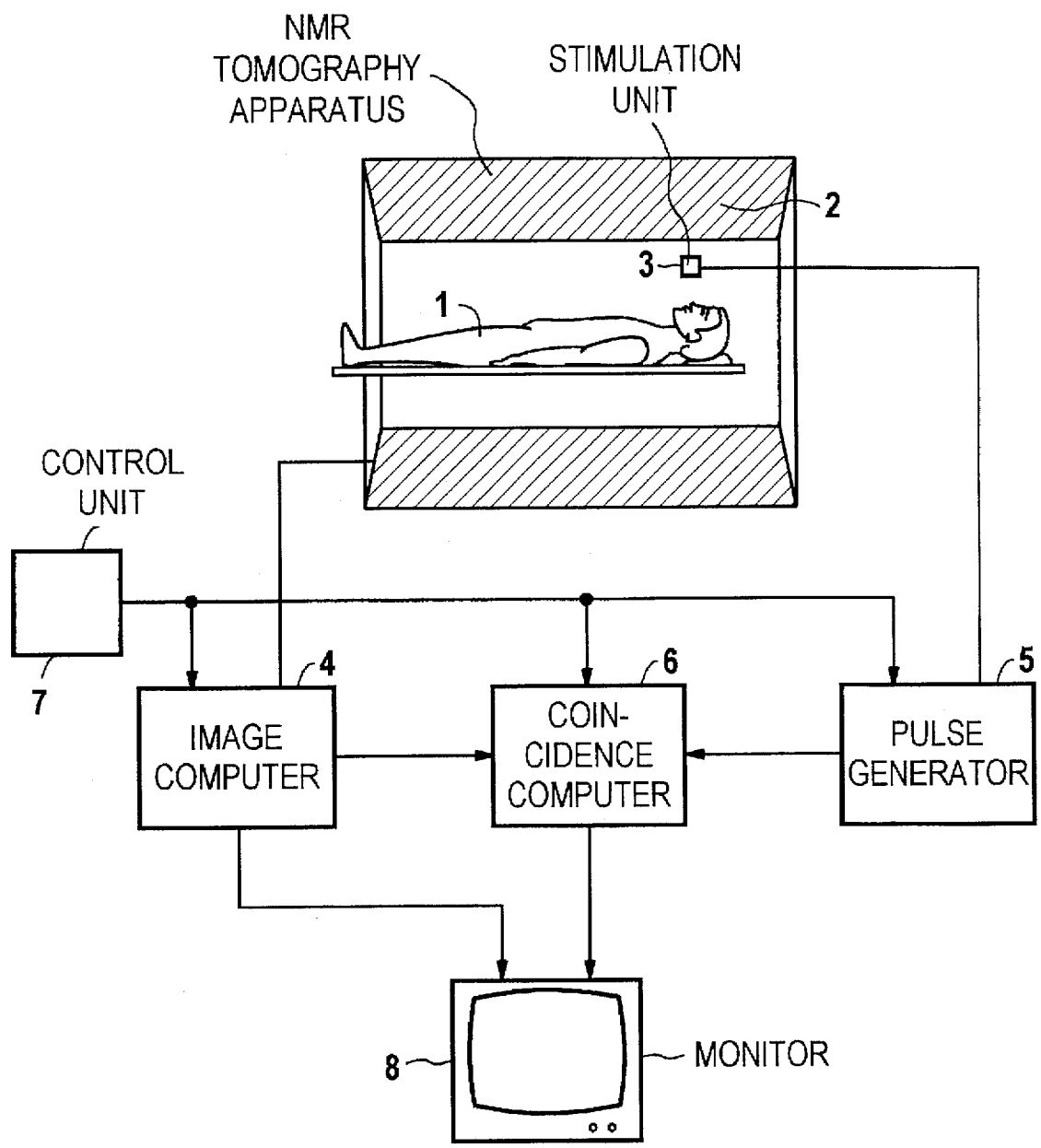
FIG. 12 schematically illustrates an arrangement for implementing the inventive method.

An arrangement for carrying out the method is schematically shown in FIG. 12. A patient 1 lies in a conventional nuclear magnetic resonance (NMR) tomography apparatus 2, as is commercially available e.g. from Siemens under the designation MAGNETOM. A stimulation unit 3 driven by a pulse generator 5 is provided in the nuclear spin tomography apparatus 2. Light flashes can be emitted by the stimulation unit 3, e.g. upon being driven by the pulse generator 5. Using the image computing unit 4, the above-explained image data sets are created before and after the stimulation, and are displayed on a monitor 8 if necessary. Using a coincidence computing unit 6, the coincidence of opposed signal changes in two pixels, displaced by N/2 rows, of the two image matrices are determined. The spatially localized brain activity thereby acquired is likewise shown on the monitor 8. The image computing unit 4, the coincidence computing unit 6 and the pulse generator 5 are driven by a control unit 7.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for functional imaging of an examination subject by magnetic resonance, comprising the steps of:

generating a basic magnetic field in which an examination subject is disposed;

stimulating said examination subject to produce neural activity in said examination subject;

conducting a measurement scan of said subject in said basic magnetic field after stimulation of said subject including charging at least a region of said subject with RF pulses, generating a phase-encoding gradient and reading out nuclear magnetic resonance signals arising in said examination subject under a readout gradient having successive pulses of alternating polarity to obtain scan values for each pulse;

entering the respective scan values for each pulse respectively in rows of a raw data matrix with directions of entry into said raw data matrix controlled dependent on the polarity of the respective pulse associated with the scan values, said raw data matrix having N rows;

generating an image data matrix having N rows from said raw data matrix by at least two-dimensional Fourier transformation, said image data matrix containing a plurality of pixels;

checking two pixels in said image data matrix disposed at a distance N/2 rows from each other for coincidence of opposed signal changes; and evaluating coincidences of signal changes which are found as representing functional activity.

2. A method as claimed in claim 1 wherein said image data matrix includes a subject image having a central region and a ghost image, and wherein the step of evaluating said coincidences comprises identifying a coincidence as representing functional activity only for respective pixels in said central region and in said ghost image wherein a signal increase in said central region coincides with a signal attenuation in said ghost image displaced by N/2 rows.

3. An apparatus for functional imaging of an examination subject by magnetic resonance, comprising:

means for generating a basic magnetic field in which an examination subject is disposed;

means for stimulating said examination subject to produce neural activity in said examination subject;

means for conducting a measurement scan of said subject in said basic magnetic field after stimulation of said subject including means for charging at least a region of said subject with RF pulses, means for generating a phase-encoding gradient and for reading out nuclear magnetic resonance signals arising in said examination subject under a readout gradient having successive pulses of alternating polarity to obtain scan values for each pulse;

means for entering the respective scan values for each pulse respectively in rows of a raw data matrix with directions of entry into said raw data matrix controlled dependent on the polarity of the respective pulse associated with the scan values, said raw data matrix having N rows;

means for generating an image data matrix having N rows from said raw data matrix by at least two-dimensional Fourier transformation, said image data matrix containing a plurality of pixels;

means for checking two pixels in said image data matrix disposed at a distance N/2 rows from each other for coincidence of opposed signal changes; and means for evaluating signal changes which are found as representing functional activity.

4. An apparatus as claimed in claim 3 wherein said image data matrix includes a subject image having a central region and a ghost image, and wherein said means for evaluating said coincidences includes means for identifying a coincidence as representing functional activity only for respective pixels in said central region and in said ghost image wherein a signal increase in said central region coincides with a signal attenuation in said ghost image displaced by N/2 rows.

* * * * *